July 13, 1965 I. F. BARDITCH ETAL 3,195,077
SEMICONDUCTOR MULTISECTION R-C FILTER OF TAPERED MONOLITHIC CONSTRUCTION HAVING PROGRESSIVELY VARIED VALUES OF IMPEDANCE PER SECTION
Filed Sept. 6, 1960
Fig. I.
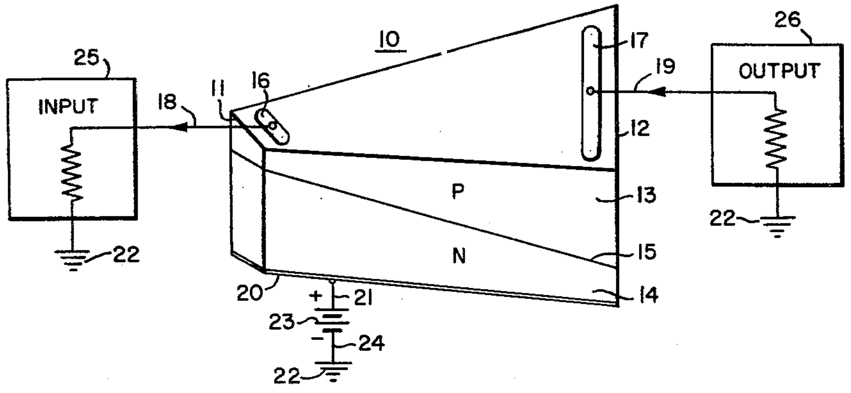
Fig. 2.
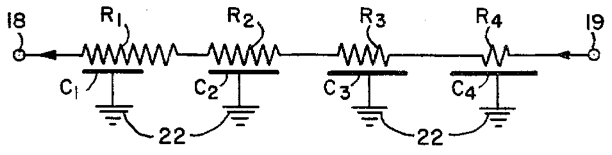
WITNESSES
Edwin E. Bassler
James F. Young
INVENTORS
Irving F. Barditch, Robert P. Donovan and Robert Bento
BY Maury I. Hull
ATTORNEY United States Patent Office 3,195,077

Patented July 13, 1965

3,195,077

SEMICONDUCTOR MULTISECTION R-C FILTER OF TAPERED MONOLITHIC CONSTRUCTION HAVING PROGRESSIVELY VARIED VALUES OF IMPEDANCE PER SECTION

Irving F. Barditch, Baltimore, and Robert P. Donovan, Severna Park, Md., and Robert Bento, Tiverton, R.I., assignors to Westinghouse Electric Corporation, East Pittsburgh, Pa., a corporation of Pennsylvania Filed Sept. 6, 1960, Ser. No. 54,070

5 Claims. (Cl. 333—70)

This invention relates to improvements in semiconductor filter devices, and more particularly to an improved semiconductor multisection filter having progressively varied values of R and C and especially suitable for a low pass filter.

It is well known in the art that a wafer of semiconductor materials comprising a p-n junction, while a reverse bias is applied to the junction, provides the effect of a filter, the reverse bias causing the formation of a depletion region or layer at the junction providing distributed capacitance, and the semiconductor material providing distributed resistance, the resistance and capacitance providing the effect of a low pass filter.

The apparatus of the instant invention makes an improvement upon the prior art structure by providing a p-n junction wafer which is essentially pie shaped, or shaped like a truncated wedge, tapering in width along the length of the wafer, and also one or both of the p and n regions may be tapering in depth along the length of the wafer, providing an arrangement in which high capacitance and low resistance per unit length are obtained at the wide end of the wedge, whereas high resistance and low capacitance per unit length are obtained at the narrow end of the wedge, the values of both R and C progressively varying in opposite senses along the length of the wafer thereby providing a tapered filter in which the impedance of each successive section is scaled upward by some factor. This results in each following section loading the previous section only lightly and provides improved operation.

Accordingly, a primary object of the instant invention is to provide a new and improved semiconductor filter structure.

Another object is to provide a new and improved semiconductor filter structure providing a multisection filter where the impedance of each successive section is scaled upward by a predetermined factor.

These and other objects will become more clearly apparent after a study of the following specification when read in connection with the accompanying drawings, in which:

FIGURE 1 is a perspective view of the device according to the preferred embodiment thereof; and FIG. 2 is an equivalent electrical circuit of the structure of FIG. 1.

Referring now to the drawings in which like reference characters are used throughout to designate like parts, for a more detailed understanding of the invention, and particularly to FIG. 1, there is shown at 10 a truncated wedge shaped wafer of semiconductor materials having a wide end 12 and a narrow end 11. The wafer comprises a region 13 of one type of semiconductivity, for example, p-type having a tapering depth small at the narrow end 11 and relatively large at the wide end 12 of the wafer. Adjacent the p-region 13 and contiguous therewith and forming a p-n junction 15 is a region 14 of the other type of semiconductivity, in this case an n-type of semiconductivity, the n-type portion or region being of relatively great depth at the narrow end 11 of the wafer and of relatively small depth at the wide end 12 of the wafer and forming with the p-region the junction 15 which is preferably of uniform thickness throughout as would result from the use of p and n regions 13 and 14 having originally uniform carrier concentrations throughout. The junction 15 may be of relatively uniform thickness as aforestated, but it will be seen that the width of the junction progressively increases along the length of the wafer 10 from end 11 to end 12. On the upper surface of the p-region 13, the surface opposite the junction, are disposed a pair of ohmic contacts 16 and 17 having leads 18 and 19 thereto, the contacts 16 and 17 preferably extending across the entire width of region 13, whereas an ohmic contact 20 is disposed preferably over substantially the entire lower surface of the n-region 14.

A circuit arrangement is provided for applying a reverse bias to the junction 15. One arrangement is that shown, where ohmic contact 20 is connected by lead 21, battery 23, and lead 24 to ground 22. The positive terminal of battery 23 is operatively connected to n-type region 14. Resistive input and output impedances 25 and 26 respectively are connected to leads 18 and 19, the biasing circuit being completed through the resistive input and output impedances to ground.

As will be readily understood by those skilled in the art, assuming uniform carrier concentration except in the depletion layer the resistance per unit length of the p-region 13 is substantially proportional to the depth, or to the area formed by a vertical plane passing through the region transverse to the longitudinal dimension, so that the resistance per unit length decreases from left to right accordingly as the depth of the region 13 increases. Junction width need not be uniform. In like manner it will be understood that since the capacity of any parallel plate device is directly proportional to the areas of the plates, as the device increases in area or width as it tapers from the narrow left end 11 toward the wide right end 12, the capacity per unit length increases because of the increased width and increased area per unit length. The width of the depletion layer in the junction may vary with the depth to which it is diffused in.

Particular reference is made now to FIG. 2. In the equivalent circuit of FIG. 2, $R_1>R_2>R_3>R_4$, whereas $C_1<C_2<C_3<C_4$. This provides an arrangement in which the impedance per filter section increases from right to left along the length of device 10, each section lightly loading the preceding section.

The result of the aforedescribed construction where each following section lightly loads the previous section provides less signal attenuation.

The apparatus of the instant invention has a number of applications; it is particularly useful at audio frequencies, in automatic gain control systems and band pass filters, and as a tuning element in a regenerative structure used in a tuned amplifier.

The carrier concentration may be the same in both regions, for example from $1\times10^{20}$ to $1\times10^{16}$ per cc., or it may be different in the two regions, and may vary within limits well known in the art, values being selected to give the desired R and C characteristics.

In summary, the invention consists of a monolithic multisection filter in which progressively varied values of resistance and capacitance are provided by tapering the width and/or depth of the semiconductor region or regions.

Another advantage in some applications is that the filter has a sharper cut-off.

Other circuits for reverse biasing the junction 15 are contemplated and are included in the invention.

Whereas both regions 13 and 14 are shown as tapering depth along the lengths thereof, it will be understood that if desired only one region may taper in depth.

If desired, both the regions may taper in width only, the depth of each remaining substantially constant, the increasing widths of the regions from the narrow to the wide end resulting in progressively increasing numbers of carriers per unit length with progressively decreasing resistance per unit length.

If desired, the width taper and the depth taper of one or both regions may be selected with respect to each other so that the R-C product remains the same at any point along the length of the device although the capacity per unit length varies.

Other tapers to provide any desired functional relationship between R per unit length and C per unit length are contemplated and are included in the invention.

Whereas the invention has been shown and described with respect to some embodiments thereof which give satisfactory results, it should be understood that changes may be made and equivalents substituted without departing from the spirit and scope of the invention.

We claim as our invention:

1. A semiconductor multisection filter having progressively varied values of resistance and capacitance per section consisting of a truncated wedge shaped semiconductor wafer having a first region of a first type of semiconductivity which tapers in width along the length of the wafer, a second region of the other type of semiconductivity adjacent the first region and forming therewith a p-n junction, said second region tapering in width along the length thereof in a manner similar to the first region, at least one of the first and second regions tapering in depth along the length thereof, said junction being adapted to have a reverse bias applied thereto to form a depletion layer providing capacitance between the first and second regions, at least one of the first and second regions having progressively decreasing resistance per unit length between the narrow end and the wide end thereof, the junction having progressively increasing capacitance per unit length between the narrow end and the wide end of the wafer, first and second ohmic connections at the narrow and wide ends of the first region, and an ohmic connection to the second region.

2. A tapered semiconductor filter structure consisting of a first region of a first semiconductivity type adjacent a second region of a second semiconductivity type and forming therewith a p-n junction, first and second ohmic connections on the surface of the first region opposite the junction at the ends thereof respectively, said first and second ohmic connections extending across substantially the entire width of the first region, an ohmic connection over substantially the entire surface of the second region opposite the junction, means connected to all the ohmic connections for applying a reverse bias to the junction, the first region tapering in depth and width along the length thereof between the first ohmic connection and the second ohmic connection, the second region tapering in width in a similar manner along the length thereof and tapering in depth along the length thereof in a manner inverse to that of the first region, the tapering of the first and second regions providing a structure in which the resistance per unit length decreases along the length thereof and the capacitance per unit length increases along the length thereof to thereby provide a multisection filter in which the impedance per section progressively increases.

3. A tapered multisection semiconductor filter structure characterized by progressively varied values of impedance along the length of the structure consisting of a first region of a first type of semiconductivity tapered in width along the length thereof, a second tapered region of a second type of semiconductivity adjacent the first region and forming therewith a p-n junction, at least one of the first and second regions tapering in depth along the length of the structure, a first ohmic connection on the first region at the narrow end thereof and a second ohmic connection on the first region at the wide end thereof, an ohmic connection on the second region, means operatively connected to the ohmic connections for applying a reverse bias to the p-n junction, said reverse biased p-n junction providing a resistance which decreases progressively along the length of the structure from the narrow end to the wide end and a capacitance which progressively increases along the length thereof from the narrow end to the wide end.

4. A monolithic semiconductor multisection filter device comprising two semiconductor regions of opposite conductivity type forming a p-n junction which when reverse biased provides a capacitance, the regions tapering in width along the length of the device whereby the capacitance per unit length of the reverse biased junction progressively varies along the length of the device, at least one of the semconductor regions tapering in depth along the length of the device to provide a progressively varying value of resistance. varying in the sense opposite to the sense of the variation of the capacitance along the length of said device.

5. A monolithic semiconductor multisection filter structure comprising two semiconductor regions forming a reverse biased p-n junction, both regions tapering in width along the length of the structure whereby the capacitance C per unit length of the reverse biased junction progressively increases along the length of the device from the narrow end to the wide end, at least one of the regions having the depth thereof tapering in a predetermined manner along the length thereof to provide progressively varying values of resistance R per unit length, the depth taper being selected in accordance with the carrier concentration and the width taper to provide a structure in which the R-C product remains substantially constant along the length of the structure.

References Cited by the Examiner

UNITED STATES PATENTS

| | | | |
|---|---|---|---|
| 2,681,993 | 6/54 | Shockley | 330—36 |
| 2,761,020 | 8/56 | Shockley | 330—36 |
| 2,816,228 | 12/57 | Johnson | 330—38 |
| 2,913,676 | 11/59 | Pankove | 307—88.5 |
| 2,959,504 | 11/60 | Ross | 317—235 |
| 3,022,472 | 2/62 | Tannenbaum | 330—39 |
| 3,118,114 | 1/64 | Barditch | 330—38 |

OTHER REFERENCES

Hager, Electronics, Sept. 4, 1959, vol. 32, No. 36, pages 44–49.

HERMAN KARL SAALBACH, *Primary Examiner.*

ELI J. SAX, *Examiner.*